United States Patent [19]

Hartemann et al.

[11] 3,813,618

[45] May 28, 1974

[54] SURFACE WAVE ELECTROMECHANICAL FILTER

[75] Inventors: Pierre Hartemann; Eugene Dieulesaint, both of Paris, France

[73] Assignee: Thomson-CSF, Paris, France

[22] Filed: July 13, 1972

[21] Appl. No.: 271,231

[30] Foreign Application Priority Data

July 16, 1971 France ............................ 71.26189

[52] U.S. Cl. .................................. 333/72, 310/9.8

[51] Int. Cl. .......................................... H03h 9/26

[58] Field of Search .............. 333/30 R, 72; 310/9.8

[56] References Cited

UNITED STATES PATENTS

| | | | |
|---|---|---|---|
| 3,376,572 | 4/1968 | Mayo | 333/72 X |
| 3,401,360 | 9/1968 | Schultz-DuBois | 333/30 R |
| 3,582,540 | 6/1971 | Adler et al. | 333/30 R X |
| 3,633,132 | 1/1972 | Hartemann | 333/30 R |
| 3,699,364 | 10/1972 | Gerard | 333/72 X |

*Primary Examiner*—Paul L. Gensler
*Attorney, Agent, or Firm*—Roland Plottel, Esq.

[57] ABSTRACT

The invention relates to a narrow band surface wave electromechanical filter, comprising arrays of radiator elements constituted by two sets of comb-shaped electrodes deposited upon the surface of a piezoelectric substrate; one of said arrays serves to excite vibrational surface waves, and the other serves to receive them; the spacing of the radiator elements is constant in each array and equal to a whole number of times the mean wavelength of operation and are either equal, or different from one another, in the two arrays; this results in a high performance narrow band filtering device.

7 Claims, 6 Drawing Figures

SURFACE WAVE ELECTROMECHANICAL FILTER

The present invention relates to electromechanical filters designed for the selective transmission of electrical signals. These filters generally have a pair of electromechanical transducers coupled to one another by means of a structure capable of transmitting vibrations. The transfer function of this kind of electromechanical filter device depends upon the frequency response characteristics of the transducers, and upon the mechanical coupling properties of the structure linking them.

If we consider the construction of a filter, it will be realised that it is difficult to the narrow the transmission band (of the transfer function) in relation to the mean value of the tuned frequency. Under these circumstances, the high selectivity which has to be achieved is governed virtually entirely by the choice of a complex virbational structure and it is necessary to design and adjust this accurately in order to obtain stable and reproducible characteristics.

The object of the invention is to overcome these difficulties of manufacture in the case of narrow-band electromechanical filters, by the use of transducers whose comb-shaped electrodes are deposited upon a piezoelectric substrate which propagates the vibrational surface waves. Using this kind of approach, the form of the transfer function is dependent upon dimensions and spacing of the electrode fingers, these being dimensional parameters which can readily be strictly controlled, using known techniques of integrated circuit manufacture.

The object of the invention is an electromechanical filter comprising an elastic propagation medium, an electromechanical excitation transducer and an electromechanical receiver transducer, arranged on a longitudinal axis of said medium, characterized in that said propagation medium is a piezoelectric substrate at the surface of which there are deposited two sets of comb-shaped electrodes whose interdigital spacings respectively constitute said excitatory and receiver transducers; each of said comb-shaped structures comprises a constant-pitch network of conductive fingers arranged at rightangles in relation to said longitudinal axis; the widths of said fingers are substantially less than said pitch.

The invention will be better understood from a consideration of the ensuing description and the attached figures in which.

Figures 1, 2:
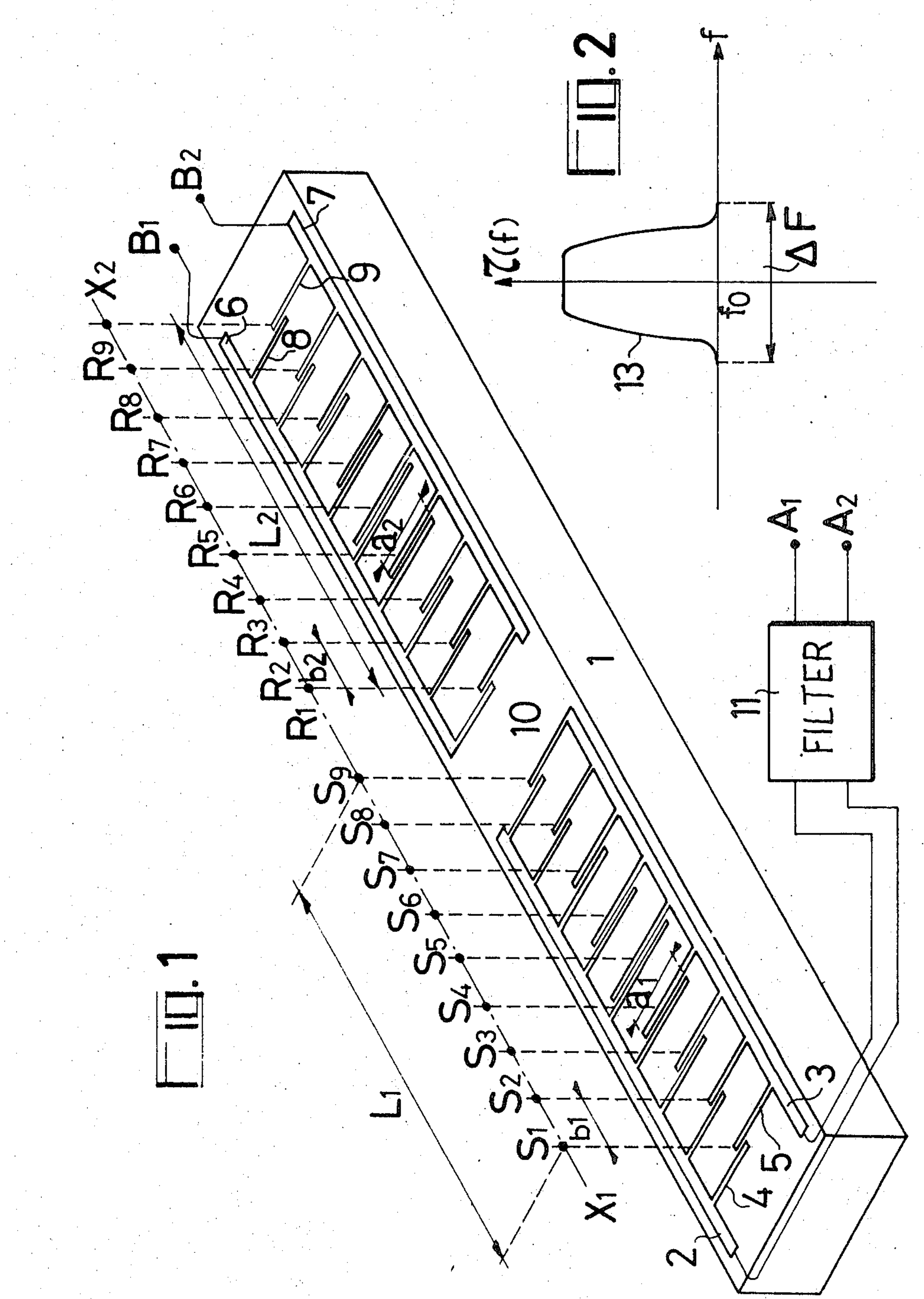
FIG. 1 is a perspective view of an electromechanical filter in accordance with the invention.
FIGS. 2 to 5 are explanatory diagrams.

In FIG. 1, an electromechanical filter in accordance with the invention, utilising surface waves, can be seen. It comprises a substrate 1 of piezoelectric material whose top face 10 carries two sets of comb-shaped electrodes defining a set of interdigital zones. These sets of electrodes cooperate with the substrate 1 in order to form excitatory and receiver transducers whose active zones are located respectively at the left-hand and righthand portions of the surface 10. The set of electrodes on the excitatory transducer comprises a first comb-shaped conductor 2 and a second comb-shaped conductor 3, whose fingers 4 and 5 are disposed perpendicularly to the longitudinal axis $X_1$ $X_2$ of the substrate 1; the axis $X_1$ $X_2$ has been drawn in on top of the substrate, to clarify the situation. The set of electrodes of the receiver transducer also comprises a first comb-shaped conductor 6 and a second comb-shaped conductor 7, whose fingers 8 and 9 are arranged in the same fashion. In the example shown in the figure, the pitch $b_1$ of the fingers of the comb structures 2 and 3, is constant, and fingers of similar order define interdigital excitatory zones of width $a_1$, and those dimensions, in the direction of the axis $X_1$, $X_2$, is substantially less than $b_1$. In FIG. 1, each interdigital excitatory zone is constituted by opposite portions of two similar order fingers, but larger groupings are equally conceivable. The pitch $b_2$ of the fingers in the comb-shaped structures 6 and 7, is likewise constant and similar order fingers delimit interdigital receiver zones of width $a_2$, just as in the case of the excitatory transducer.

By applying a voltage between the combs 2 and 3, the interdigital excitatory zones give rise to electrical induction fields which act upon the piezoelectric material of the substrate 1. In proximity of the face 10 and at each of the excitation zones, there develop vibrational surface waves which propagate parallel to the longitudinal axis $X_1X_2$ of the substrate. The points of emission of these waves have been marked by the dotted lines on the axis $X_1$ $X_2$; the sources $S_1$ to $S_9$ symbolise the interdigital zones of the excitatory tranducers; they form a regular alignment of radiating sources of length $L_1$. The radiated surface waves propagate along the face 10 in the direction of the receiver transducer and mechanically excite the array of receiver elements $R_1$ to $R_9$. An induced voltage thus developes between a pair of terminals $B_1$ and $B_2$, with an instantaneous amplitude which is proportional to the algebraic sum of the vibrational amplitudes picked up by the elements $R_1$ and $R_9$.

The receiver array $R_1$ to $R_9$ has a length $L_2$; with the excitatory array $S_1$ to $S_9$, it forms a surface wave transmission system whose selectivity depends essentially upon the pitches $b_1$ and $b_2$, the excitatory and receiving sensitivities which are proportional to $a_1$ and $a_2$, and the velocity of propagation $c$ of the surface waves, along the face 10 of the substrate 1.

In FIG. 1, it can be seen how the comb structures 2 and 3 are excited through the medium of a filter 11 whose transfer function $\pi(f)$ is represented in FIG. 2 by the curve 13; the centre frequency is $f_o$ and the transmitted frequencies range from $f_o - \Delta F/2$ to $f_o + \Delta F/2$. The purpose of the filter 11 will be explained in more detail in the later description.

To understand the operation of the device shown in FIG. 1, let us make the hypothesis that the excitation and receiving zones are of the same width, that the arrays $S_1 - S_9$ and $R_1 - R_9$ are identical and that the pitch of the interdigital zone is equal to a whole number of times the mean wavelength of operation $\lambda_o = (c/f_o)$.

Figure 3:
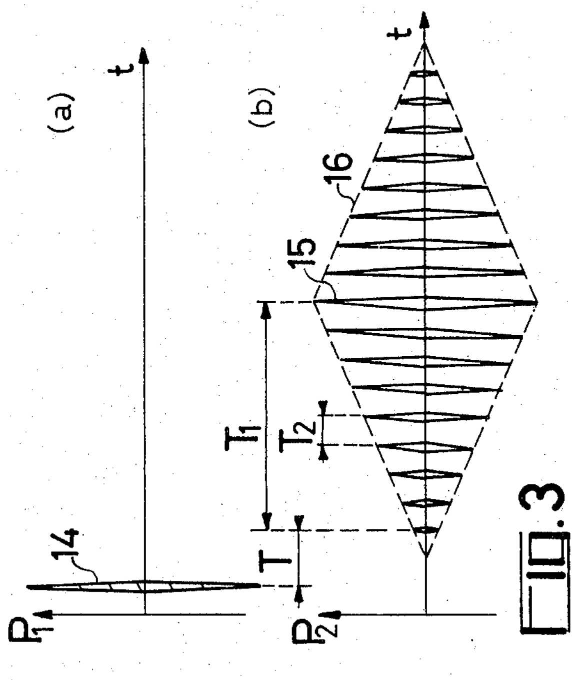

Under these circumstances, it is easy to deduce the percussion response of the filter shown in FIG. 1, since it is merely necessary to apply to the comb structures 2 and 3 the pulse voltage $P_1$ marked (a) in FIG. 3; this is obtained by modulating a sinusoidal carrier of frequency $f_o$, by a short squarewave pulse 14. The pulse 14 triggers the simultaneous emission of vibrational pulses by the sources $S_1$ to $S_9$, which, after having propagated along the axis $X_1$, $X_2$, reach the receiver elements $R_1$ to $R_9$; the result is that between the terminals $B_1$ and $B_2$ a train of pulses $P_2$ appears, and this has been marked (b) in FIG. 3. The train of pulses $P_2$ starts with a delay T equal to the time taken by the vibrational pulse emitted at $S_9$, to reach the element $R_1$; the pulses 15 succeed one another at time intervals $T_2$ equal to the time taken by the surface waves to cover the distance $b_1$ or $b_2$ which separates the teeth of the combs; the triangular envelope 16, which contains the pulses, extends over a time interval equal to twice the time $T_1$ taken by the surface wave to transit the total length of a set of combs. With a knowledge of the percussion response $P_2$ of the filter shown in FIG. 1, the filter transfer function can readily be deduced. This transfer function M (f) is represented in FIG. 4 and is the result of the application of the Fourier transform principles.

Figure 4:
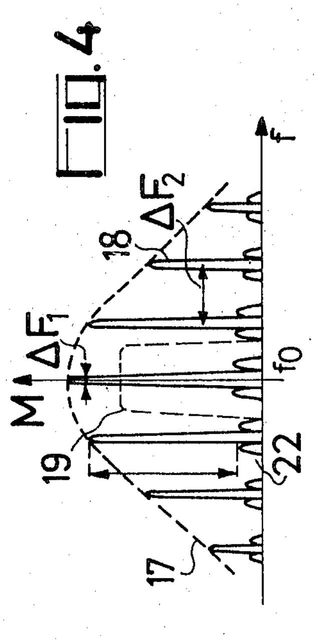

The diagram of FIG. 4 shows how the transfer function M (f) is made up of several peaks 18 each with a main lobe surrounded by secondary lobes 22; the peaks are repeated at frequency intervals $\Delta F_2$. The main lobe of the peak centred at frequency $f_o$, has a width $\Delta F_1$ which is much smaller than $\Delta F_2$, and it can be shown that the shape of each peak 18 is analytically represented by the function $(\sin x/x)^2$, where $x$ is a variable proportional to $f$.

In this case, the secondary lobes are located 26 dB below the peak level of the main lobe. It can be shown, too, that the width $\Delta F_1$ of the main lobe is in the order of half the reciprocal of $T_1$, and that the interval $\Delta F_2$ is in the order of the reciprocal of T2. The envelope curve 17 is in connection with the form of the elementary transducers.

The amplitude-frequency response of the filter shown in FIG. 1, exhibits several very narrow transmission peaks. In order to isolate the central peak in the case where the comb structures have the same pitch, preliminary filtering by means of the circuit 11 is carried out. The transmission curve 19 shown in dotted fashion in FIG. 4, is that of a preliminary filtering circuit 11 which is able to select the central peak.

By way of a non-limitative example, a filter in accordance with the invention can be designed which has a central transmission frequency of $f_o = 200$ MC/s, using a quartz substrate 9 cm long. By using a masking operation to produce two sets of comb electrodes 4 cm long each with 20 fingers, it will be seen that if the velocity of propagation c of the surface waves is equal to 3,000 m/s, the frequency bands $\Delta F_1$ and $\Delta F_2$ will respectively be 40 KC/s and 1.6 MC/s. The preliminary filtering circuit 11 will thus have a band width $\Delta F$ of around 1.6 MC/s and the assembly shown in FIG. 1 will behave, between the terminals $A_1$ $A_2$ and $B_1$ $B_2$, as a highly selective filter with a relative pass-band of $(\Delta F1/f_o) = 2.10^{-4}$.

In the foregoing, the interdigital zones of the two transducers all have the same width and the same spacing. However, this design of the comb-shaped electrodes, is not without its drawbacks.

A first improvement is to vary, along each array, the width $a_1$ or $a_2$ of the interdigital zones in order to weight the vibrational amplitudes excited by the sources $S_1$ to $S_9$, and the voltages at the terminals $B_1$ $B_2$ of the receiver $R_1$ to $R_9$; this technique results in a slight increase in the width of the main lobe but it makes it possible to considerably reduce the levels of the secondary lobes. By way of a non-limitative example, this weighting can be effected in accordance with a co-sine law by an appropriate modification of the length of the fingers of the transducer combs. The amplitude weighting can also be effected by using a Dolf profile, in the manner conventionally employed in antenna design.

Another improvement consists in using different spacings $b_1$ and $b_2$ in the excitatory and receiver comb transducers.

It has been shown that when the spacings $b_1$ and $b_2$ are identical, the amplitude-frequency response of the surface wave filter obeys the law $(\sin x/x)^2$, where $x$ is a reduced variable corresponding to the frequency $f$. If the spacings $b_1$ and $b_2$ are dissimilar, the amplitude response can be placed in the form of a product $(\sin x/x)$ $(\sin x'/x')$ where $x$ and $x'$ are separate variables proportional to $f$. The factor $\sin x/x$ defines the response $M_1$ of the excitatory transducer on its own, this being illustrated at (a) in FIG. 5; the factor $(\sin x'/x')$ defines the response $M_2$ of the receiver transducer on its own, and is indicated at (b) in the same figure; the overall response for the two transducers is $M_{12} = M_1 \times M_2$ and this has been represented by (c) in FIG. 5.

Figure 5:
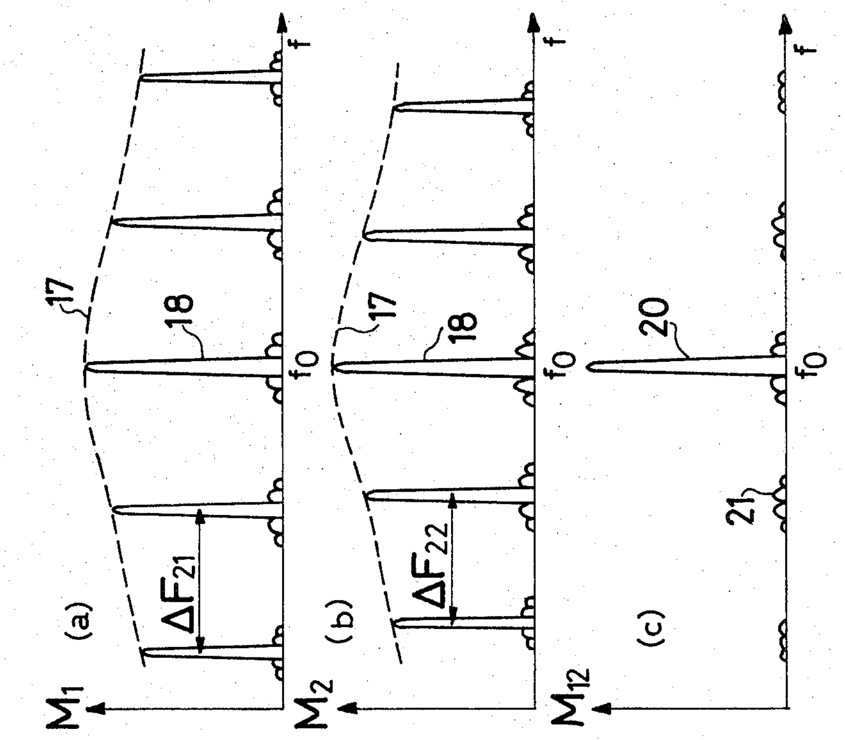

Considering FIG. 5, it will be seen that the peaks 18 of the response $M_1$ have a frequency spacing of $\Delta F_{21}$ which differs from the spacing $\Delta F_{22}$ of the peaks 18 in the response curve $M_2$. If the spacings $\Delta F_{21}$ and $\Delta F_{22}$ are appropriately chosen, then it will be seen that the overall response $M_{12}$ simiply contains the central peak 20 and residual peaks 21 of negligible amplitude.

Thus, through the choice of two different spacings, it is possible to create a surface wave filter having only one transmission peak, without it being necessary to precede it or follow it by a preliminary filter circuit 11.

The difference between the spacings $\Delta F_{21}$ and $\Delta F_{22}$ of the transfer functions $M_1$ and $M_2$, can be obtained, in accordance with the invention, by making the spacings $b_1$ and $b_2$ respectively equal to $n$ times and $p$ times the wavelength $\lambda_o = (c/f_0)$.

The whole numbers $n$ and $p$ are chosen in order that one of them is neither a multiple nor a sub-multiple of the other; if this condition is satisfied, when the central peaks of the functions $M_1$ and $M_2$ are made to coincide the other peaks cannot coincide.

In addition, for the residual peaks 21 to have a negligible amplitude as soon as one moves away from the frequency of the central peak 20 in FIG. 5, the condition:

$$\left| \Delta F_{21} - \Delta F_{22} \right| > \Delta F_1$$

must be satisfied.

If we consider two arrays having lengths $L_1$ and $L_2$ which are substantially identical, the foregoing unbalanced equation means that:

$$\left| (1/b_1 - (1/b_2 \right| > (1/L_1 + L_2)$$

Figure 6:
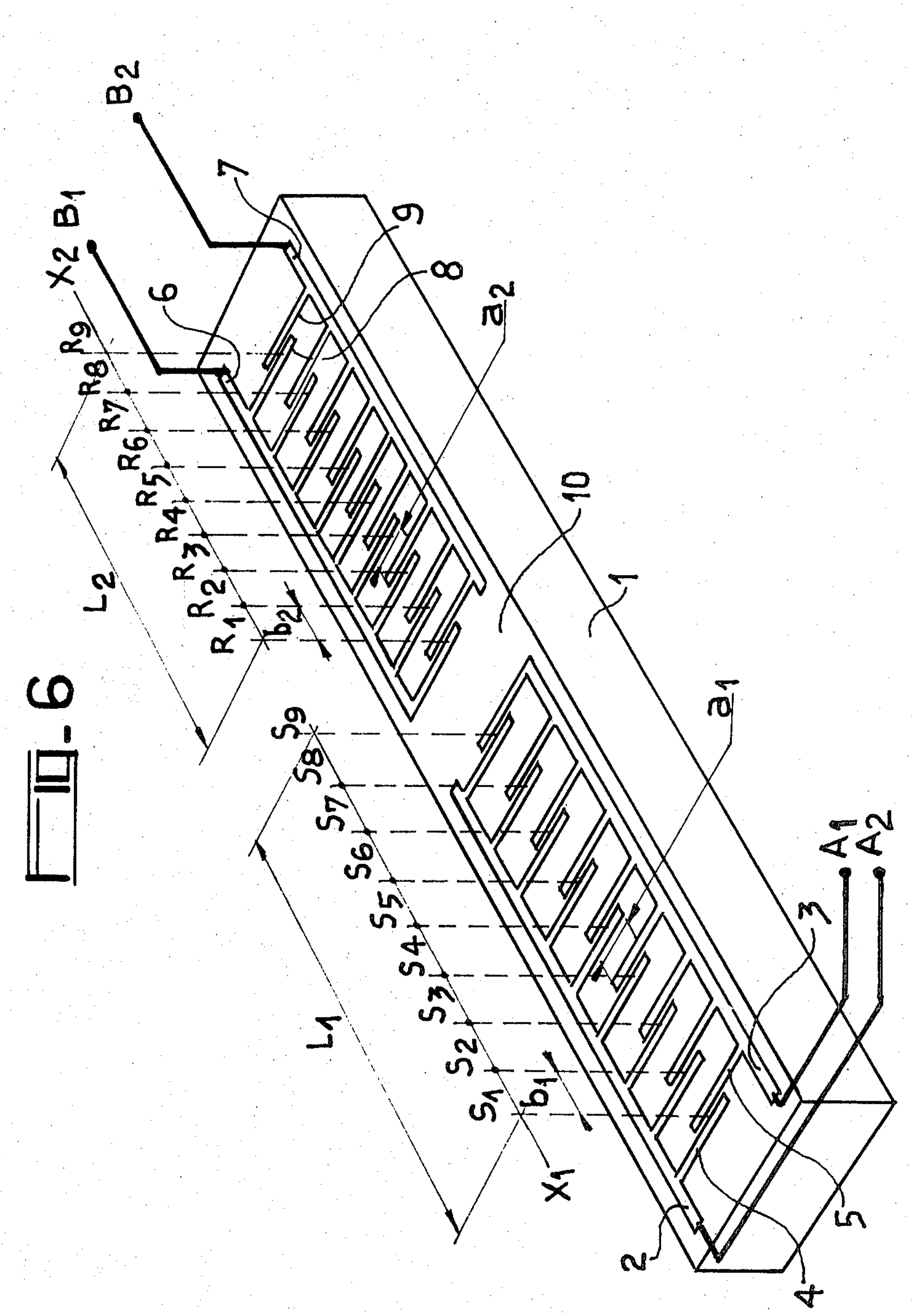
FIG. 6 is a perspective view of an electromechanical filter in accordance with a further embodiment of the invention.

FIG. 6 is a perspective view of an alternative embodiment. It is similar to FIG. 1, and like elements in both figures bear like legend. It may be noticed (1) that the length L-1 of the sending array S-1 to S-9 is different from the length L-2 of the receiving array R-1 through R-9; while (2) there are an equal number of fingers (18) and excitation zones (nine) in each array. In other words, the pitch of the sending array (i.e. the equidistant spacing between adjacent interdigital excitatory zones $b$-1 in the sending array) and the pitch of the receiving array (i.e. the distance between the adjacent interdigital excitatory zones in the receiving array as shown by *b*-2) are different. It may be noted that all the spaces between the interdigital excitatory zones in the sending array b-1 are equal, and all of the spacing between the adjacent interdigital excitatory zones in the receiving array b-2 are also equal. Furthermore, it will be noted that the width a-1 and a-2 of the interdigital excitatory zones in both the sending and the receiving array are equal. The operation of this embodiment has been described before and it need not be repeated.

What I claim is:

1. A narrow-band electromechanical filter for high frequency signals comprising a piezoelectric substrate and applied to said substrate excitatory and receiver transducers arranged on a longitudinal axis at the surface of said substrate, each of which includes a set of two comb-shaped electrodes having interleaved conductive fingers arranged at right angles in relation to said longitudinal axis, fingers of similar order facing each other on mutually overlapping opposite portions and defining an array of interdigital zones or radiator elements, the spacing between said radiator elements, or pitch of the array, being constant in each transducer and equal to a whole number of times the mean wavelength of operation, said whole number of times being greater than one.

2. An electromechanical filter as claimed in claim 1, characterized in that said arrays have the same pitch, preliminary filter means being coupled to said filter; the transmitted frequency band of said preliminary filtering means is less than the reciprocal of the time taken by said surface wave to transit a distance equal to said pitch.

3. An electromechanical filter as claimed in claim 1, characterized in that the mutually opposite portions of the fingers of similar order belonging to each of said sets of comb-shaped electrodes, have equal overlapping opposite portions.

4. An electromechanical filter as claimed in claim 1, characterized in that the mutually opposite portions of the fingers of similar order, belonging to each of said sets of comb-shaped electrodes have dissimilar overlapping opposite portions.

5. An electromechanical filter as claimed in claim 1, characterized in that said surface is a flat surface containing said axis and said arrays of radiator elements are orientated along said axis.

6. An electromechanical filter as claimed in claim 1, characterized in that considering the excitatory transducers on the one hand and the receiver transducers on the other, the pitches of said arrays have different values; the smallest of said values is not contained a whole number of times in the other value.

7. An electromechanical filter as claimed in claim 6, characterized in that the difference between the reciprocals of said values is greater in absolute value than the reciprocal of the sum of the length of said arrays, said lengths being substantially equal.

* * * * *